United States Patent
Hsu et al.

(10) Patent No.: US 11,627,657 B2
(45) Date of Patent: Apr. 11, 2023

(54) STRETCHABLE CONDUCTIVE SUBSTRATE

(71) Applicant: National Yang Ming Chiao Tung University, Hsinchu (TW)

(72) Inventors: Chain-Shu Hsu, Hsinchu County (TW); Wen-Chang Fan, Hsinchu County (TW); Chia-Pin Wang, Miaoli County (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 17/393,703

(22) Filed: Aug. 4, 2021

(65) Prior Publication Data
US 2023/0042692 A1 Feb. 9, 2023

(51) Int. Cl.
*H05K 1/02* (2006.01)
*H05K 1/09* (2006.01)

(52) U.S. Cl.
CPC ............. *H05K 1/0283* (2013.01); *H05K 1/09* (2013.01); *H05K 2201/09227* (2013.01); *H05K 2201/09263* (2013.01)

(58) Field of Classification Search
CPC ....... H05K 1/0277; H05K 1/09; H05K 1/0283
See application file for complete search history.

(56) References Cited

U.S. PATENT DOCUMENTS

| 10,321,563 B2 | 6/2019 | Robinson et al. |
| 2021/0363308 A1 | 11/2021 | Michigami et al. |

FOREIGN PATENT DOCUMENTS

| CN | 107148808 A | 9/2017 | |
| CN | 112616244 A | 4/2021 | |
| WO | WO 2017188236 A1 * | 11/2017 | ........... H05K 1/0277 |
| WO | 2020095928 A1 | 5/2020 | |

OTHER PUBLICATIONS

Ogura, Shingo; Machine translation of WO 2017188236 A1, 2017 (Year: 2017).*

* cited by examiner

*Primary Examiner* — Jeremy C Norris
(74) *Attorney, Agent, or Firm* — Li & Cai Intellectual Property (USA) Office

(57) ABSTRACT

A stretchable conductive substrate includes a substrate and a circuit layer. The substrate has a plurality of predetermined areas. The circuit layer is formed on the substrate and defines a conductive contact group and at least one elastic wire structure connected to the conductive contact group in each of the predetermined areas. The at least one elastic wire structure has at least one patterned wire segment and a stretch rate thereof along a length direction of the substrate is from 0% to 60%.

7 Claims, 15 Drawing Sheets

STRETCHABLE CONDUCTIVE SUBSTRATE

FIELD OF THE DISCLOSURE

The present disclosure relates to a conductive substrate, and more particularly to a stretchable conductive substrate, which can be applied to flexible electronic devices such as an electronic skin and a flexible display.

BACKGROUND OF THE DISCLOSURE

With the development of electronic technologies, flexible electronic devices are getting more and more attention. Compared to the conventional electronic devices, the flexible electronic devices can work normally under a certain degree of deformation (e.g., bending or stretching deformation), thus having high flexibility of use, and is thus more adaptable to different working environments.

In the related art, a flexible substrate is used in place of a rigid material substrate, so that a resulting electronic device can be bent or stretched, thereby increasing the convenience of use and operation. However, such an approach cannot prevent metal wires from being damaged due to a bending or stretching stress and suppress impedance changes of the metal wires caused by a bending or stretching deformation.

SUMMARY OF THE DISCLOSURE

In response to the above-referenced technical inadequacies, the present disclosure provides a stretchable conductive substrate that is able to provide a balance between stretchability and electrical property stability.

In one aspect, the present disclosure provides a stretchable conductive substrate that includes a substrate and a circuit layer. The substrate has a plurality of predetermined areas. The circuit layer is formed on the substrate, and defines a conductive contact group and at least one elastic wire structure connected to the conductive contact group in each of the predetermined areas. The at least one elastic wire structure has at least one patterned wire segment, and a stretch rate thereof along a length direction of the substrate is from 0% to 60%.

In one embodiment of the present disclosure, the at least one patterned wire segment has at least one first bent portion and at least one second bent portion connected to each other. A curvature of the at least one first bent portion is less than that of the at least one second bent portion.

In one embodiment of the present disclosure, the curvature of the at least one first bent portion is from 0.1 mm to 10 mm. The curvature of the at least one second bent portion is from 0.5 mm to 15 mm.

In one embodiment of the present disclosure, the at least one patterned wire segment has a plurality of hollow pattern units that are connected to each other and linearly arranged along the length direction of the substrate. Each of the hollow pattern units is in the shape of an n-sided polygon, where n is an integer greater than or equal to 3.

In one embodiment of the present disclosure, the stretchable conductive substrate further includes an elastic conductive layer. The elastic conductive layer is formed on the circuit layer.

In one embodiment of the present disclosure, the elastic conductive layer is formed from a conductive composition. Based on 100 wt % of the conductive composition, the conductive composition includes 45 wt % to 65 wt % of a conductive material that is selected from the group consisting of gold, palladium, platinum, nickel, copper, copper-clad silver, graphene, and carbon nanotubes.

In one embodiment of the present disclosure, each of the hollow pattern units includes a plurality of corner portions and a plurality of straight edge portions. Any adjacent two of the corner portions have one of the straight edge portions therebetween. The elastic conductive layer includes a plurality of elastic conductive structures, and the corner portions of each of the hollow pattern units each have one of the elastic conductive structures thereon.

In one embodiment of the present disclosure, an overlap rate between each of the corner portions and the corresponding one of the elastic conductive structures is from 5% to 50%.

In one embodiment of the present disclosure, each of the hollow pattern units includes a plurality of corner portions and a plurality of straight edge portions. Any adjacent two of the corner portions have one of the straight edge portions therebetween. The elastic conductive layer includes a plurality of elastic conductive structures, and the straight edge portions of each of the hollow pattern units each have one of the elastic conductive structures thereon.

In one embodiment of the present disclosure, an overlap rate between each of the straight edge portions and the corresponding one of the elastic conductive structures is from 5% to 50%.

In one embodiment of the present disclosure, the stretchable conductive substrate further includes an elastic conductive layer. The elastic conductive layer is formed on the circuit layer and includes a plurality of elastic conductive structures. The at least one patterned wire segment has a plurality of solid pattern units that are separated from each other at a distance and linearly arranged along the length direction of the substrate. Any adjacent two of the solid pattern units are electrically connected to each other via one of the elastic conductive structures. Each of the solid pattern units is in the shape of an n-sided polygon, where n is an integer greater than or equal to 3.

One of the beneficial effects of the subject matter provided by the present disclosure is that, the stretchable conductive substrate can reduce or even eliminate fragility points of wires, thereby greatly reducing the risk of wire breaking during a stretching process, and can allow the wires to have good elastic recovery performance and electrical property stability (an impedance change in a stretched state is very small), by virtue of "the at least one elastic wire structure has at least one patterned wire segment and a stretch rate thereof along a length direction of the substrate is from 0% to 60%".

Furthermore, the stretchable conductive substrate can further include an elastic conductive layer. The elastic conductive layer is formed from a conductive composition (e.g., a conductive slurry) that is applied to the circuit layer. Accordingly, metal wires can be prevented from being damaged due to a bending or stretching stress, and an impedance change caused by a bending or stretching deformation of the metal wires can be suppressed.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
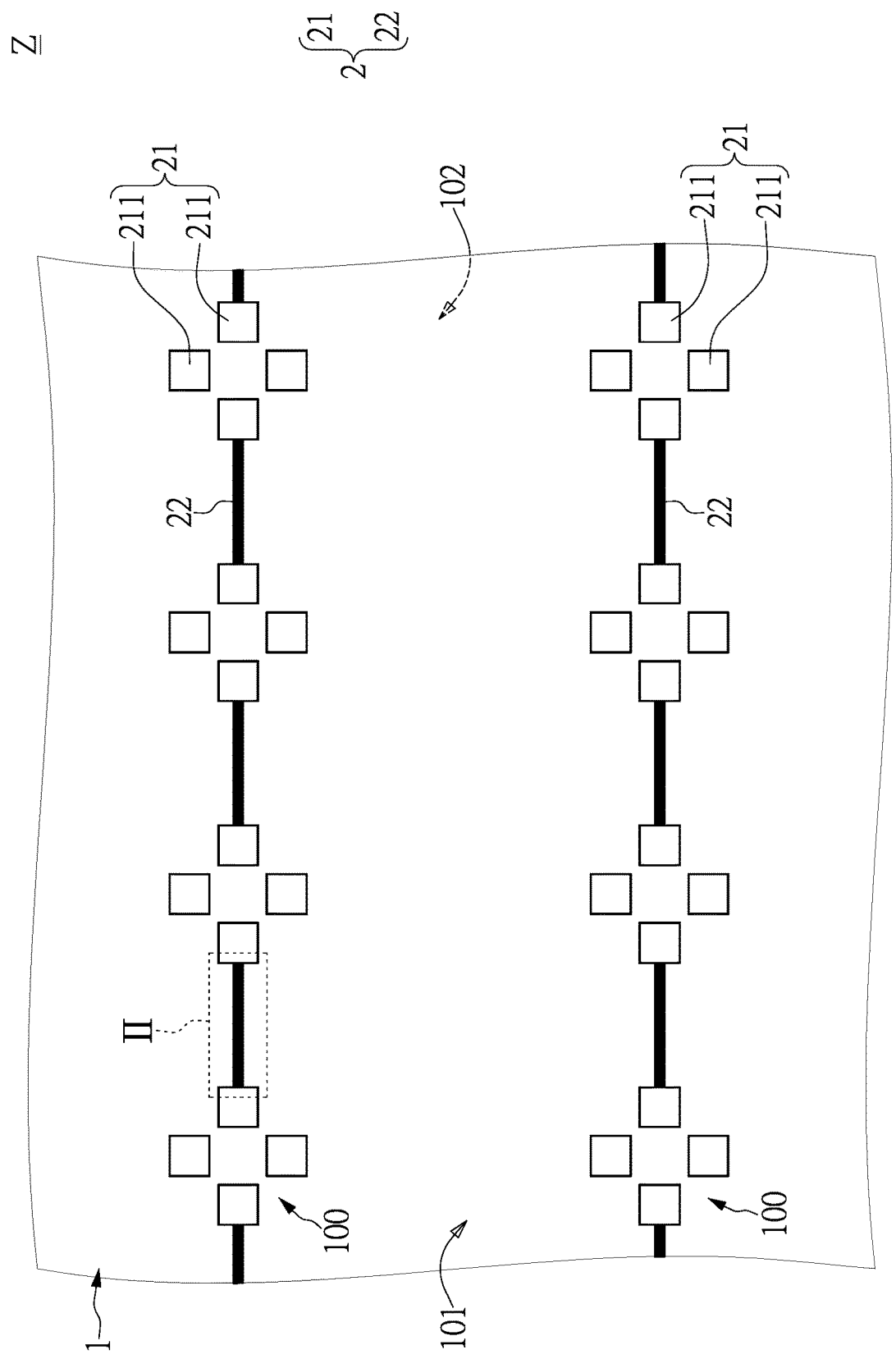
FIG. 1 is a structural schematic view of a stretchable conductive substrate according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Unless defined otherwise, all technical terms used herein have the same meanings as commonly understood by one of ordinary skill in the art to which the present disclosure pertains. The materials used in the following examples are commercially available materials unless otherwise specified. The operations or instruments used in the following embodiments are common operations or instruments in the art unless otherwise specified. The ratios, contents, etc., described in the following embodiments are all by weight unless otherwise specified.

First Embodiment

Figure 2:
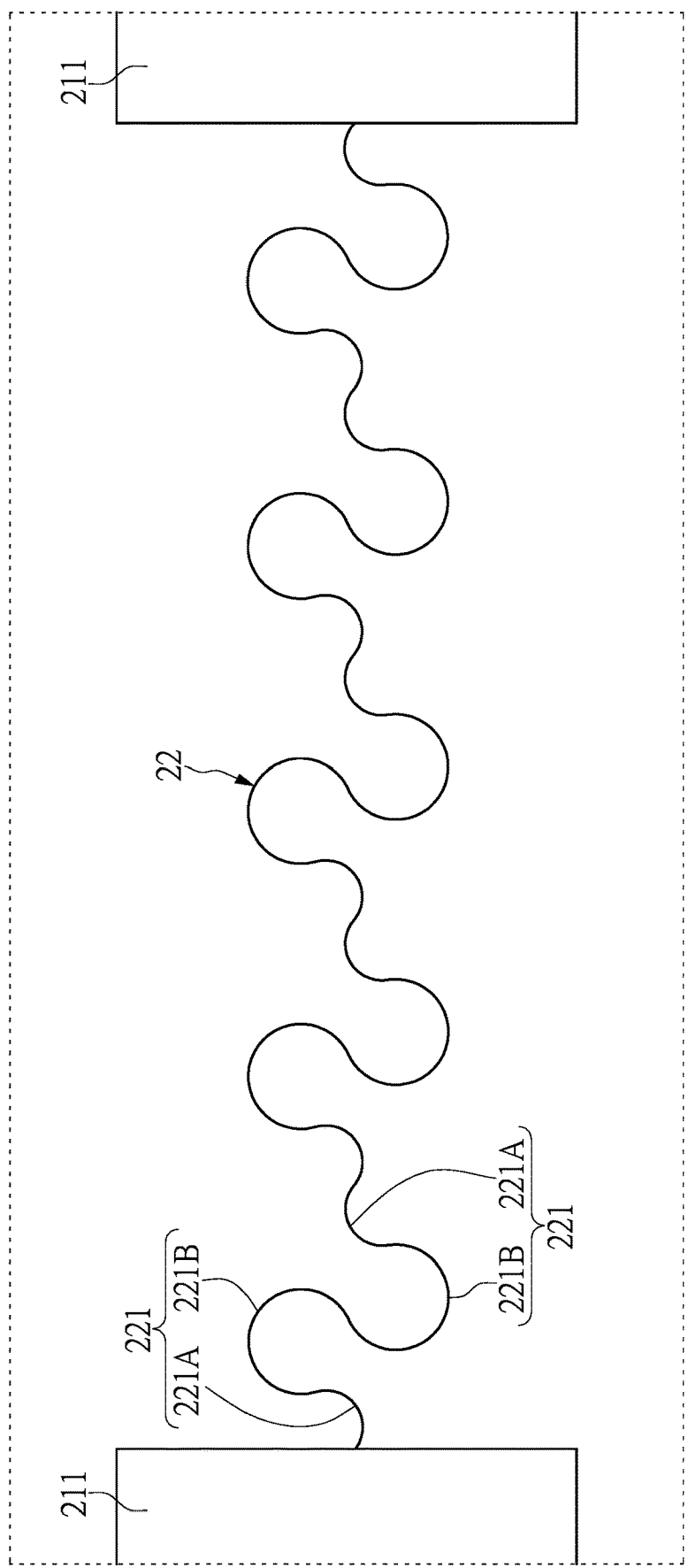
FIG. 2 is an enlarged view of part II of FIG. 1, showing a wire design according to the first embodiment of the present disclosure.

Referring to FIG. 1 and FIG. 2, FIG. 1 showing a main structure of a stretchable conductive substrate Z of the present disclosure, FIG. 2 showing a wire design of the stretchable conductive substrate Z, the stretchable conductive substrate Z mainly includes a substrate 1 and a first circuit layer 2. The substrate 1 has a plurality of predetermined areas 100, which can be disposing areas of electronic components such as light emitting elements and detectors. The first circuit layer 2 is formed on the substrate 1, and defines a conductive contact group 21 and at least one elastic wire structure 22 connected to each other in each of the predetermined areas 100. In practice, the conductive contact group 21 can include a plurality of conductive contacts 211, which can serve as connecting interfaces and/or signal transmitting interfaces of the electronic components. The conductive contacts 211 can be in the form of contact pads, but are not limited thereto. It should be noted that, the quantity and distribution position of the conductive contacts 211 and the at least one elastic wire structure 22 in each of the predetermined areas 100 are not particularly limited, and can be adjusted and designed according to particular requirements.

It is worth mentioning that, the elastic wire structure 22 has at least one patterned wire segment 221, thus having good elastic recovery performance, such that it can withstand a certain degree of stretching deformation and will cause a small impedance change when being stretched. According to test results, a stretch rate of the elastic wire structure 22 along a length direction of the substrate 1 is from 0% to 60%.

In the present embodiment, the substrate 1 can be an elastic substrate having bendable and stretchable properties. The substrate 1 has a first surface 101 (e.g., an upper surface) and a second surface 102 (e.g., a lower surface) opposite to the first surface 101. The first circuit layer 2 is formed on the first surface 101 of the substrate 1, so as to provide conductive contacts and signal transmitting lines. In practice, a material of the substrate 1 is exemplified by polyethylene terephthalate (PET), polymethyl methacrylate (PMMA), Polyimide (PI), and polycarbonate (PC). A material of the first circuit layer 2 is exemplified by metals with good electrical conductivity such as gold, silver, and copper and their alloys. However, such examples are not intended to limit to the present disclosure.

More specifically, as shown in FIG. 2, the patterned wire segment 221 of the elastic wire structure 22 has at least one first bent portion 221A and at least one second bent portion 221B connected to each other, and a curvature of the at least one first bent portion 221A is less than that of the at least one second bent portion 221B. Preferably, the curvature of the at least one first bent portion 221A is from 0.1 mm to 10 mm, such that the at least one first bent portion 221A has a smaller movable and stretchable margin. The curvature of the at least one second bent portion 221B is from 0.5 mm to 15 mm, such that the at least one second bent portion 221B has a larger movable and stretchable margin. Such a structural design can reduce or even eliminate fragility points of wires, thereby greatly reducing the risk of wire breaking during a stretching process, and can allow the wires to have good elastic recovery performance and electrical property stability (an impedance change in a stretched state is very small). It should be noted that, when the at least one first bent portion 221A and the at least one second bent portion 221B are each present in a quantity of two or more, the arrangement of which is not particularly limited. For example, the two first bent portions 221A and the two second bent portions 221B can be in the arrangement of ABAB or ABBA to form the patterned wire segment 221.

Figure 3:
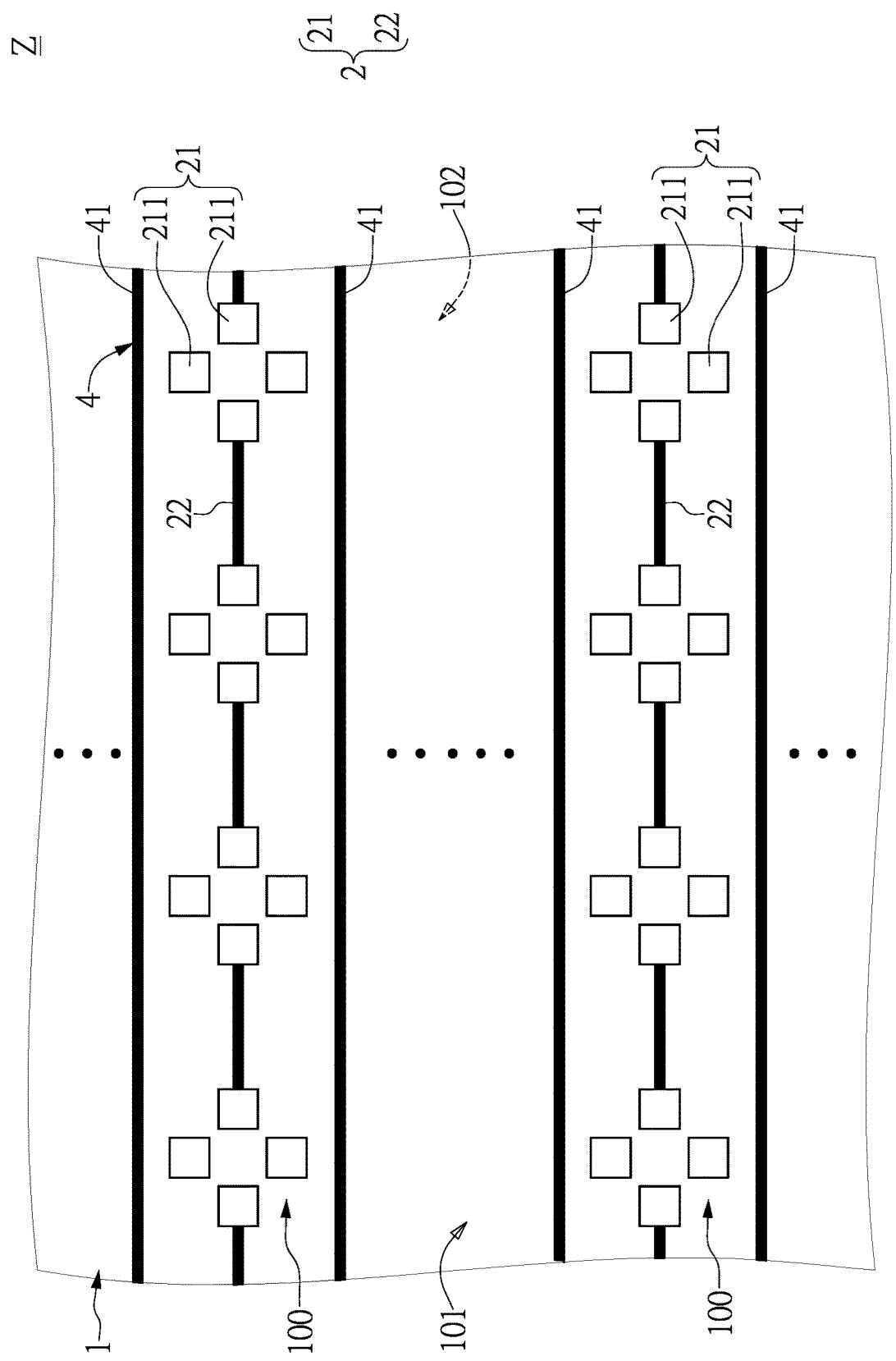
FIG. 3 is another structural schematic view of the stretchable conductive substrate according to the first embodiment of the present disclosure.
Figure 4:
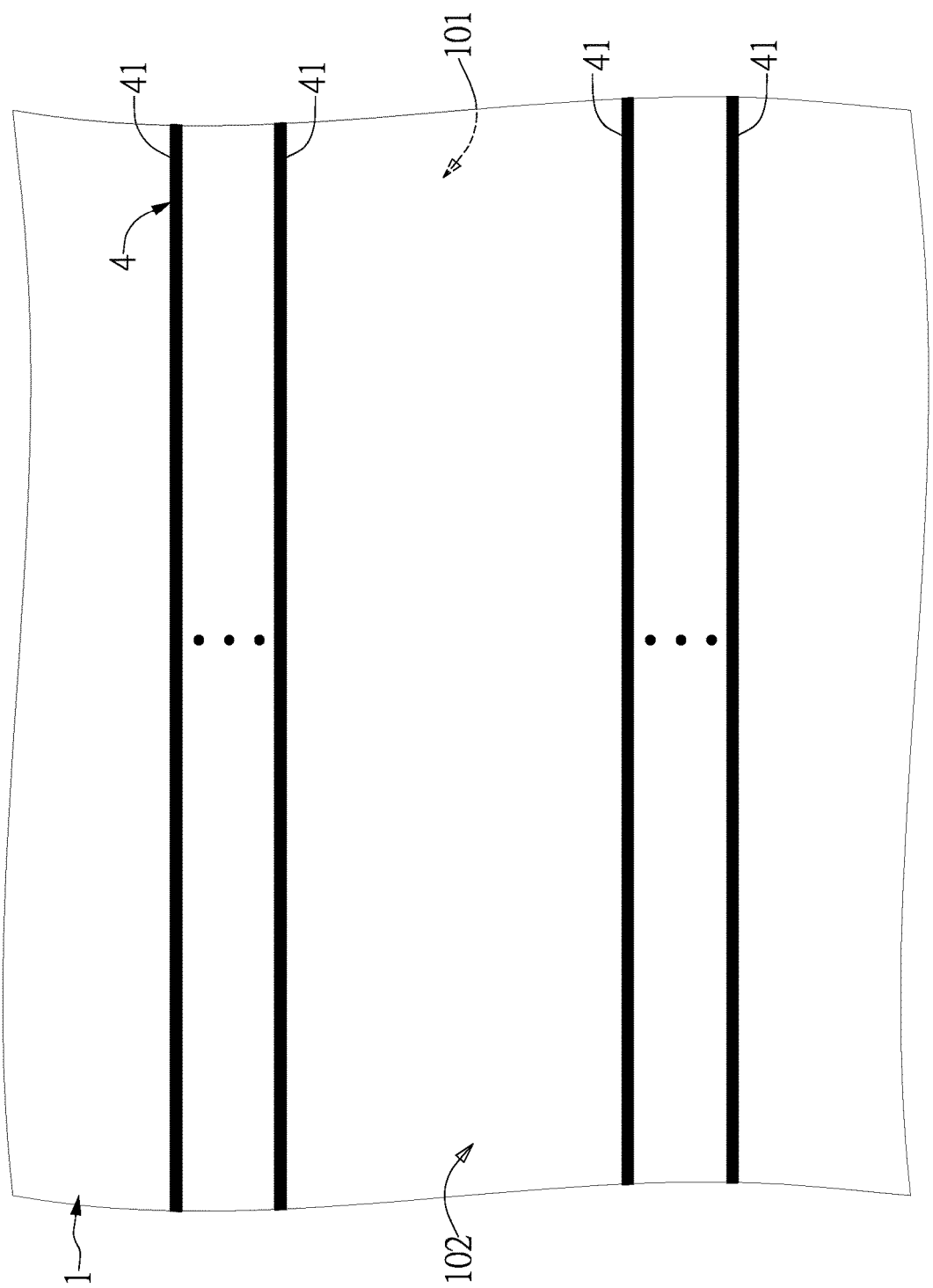
FIG. 4 is still another structural schematic view of the stretchable conductive substrate according to the first embodiment of the present disclosure.

Referring to FIG. 3 and FIG. 4, showing other implementable structures of the stretchable conductive substrate Z, the stretchable conductive substrate Z of the present disclosure can further include a second circuit layer 4 for increasing the flexibility of circuit layout design. The second circuit layer 4 can be formed on the first surface 101 of the substrate 1 while avoiding the position where the first circuit layer 2 is formed. That is, the second circuit layer 4 and the first circuit layer 2 are not overlapped with each other on the first surface 101 of the substrate 1. Also, the second circuit layer 4 can be formed on the second surface 102 of the substrate 1.

More specifically, the second circuit layer 4 can include a plurality of signal transmitting lines 41 for transmitting electrical signals (e.g., current signals or voltage signals). It is worth mentioning that, the signal transmitting lines 41 can adopt the wire design as described in the present embodiment (i.e., the patterned wire segment 221 has a first bent portion 221A having a lower curvature and a second bent portion 221B having a larger curvature) to have the same or similar technical effects. In practice, under the structure as shown in FIG. 3, the second circuit layer 4 can be electrically connected to first circuit layer 2 in a direct contact manner. In addition, under the structure as shown in FIG. 4, the second circuit layer 4 can be electrically connected to first circuit layer 2 via one or more conductive vias (not shown). For example, one of the conductive contacts 211 in each of the predetermined areas 100 can be electrically connected to one of the signal transmitting lines 41 by the corresponding conductive via.

Although FIG. 3 and FIG. 4 show that the signal transmitting lines 41 extend along a direction parallel to the length direction of the substrate 1, according to different circuit layout designs, the signal transmitting lines 41 can also extend along a direction perpendicular to the length direction of the substrate 1.

Second Embodiment

Figure 5:
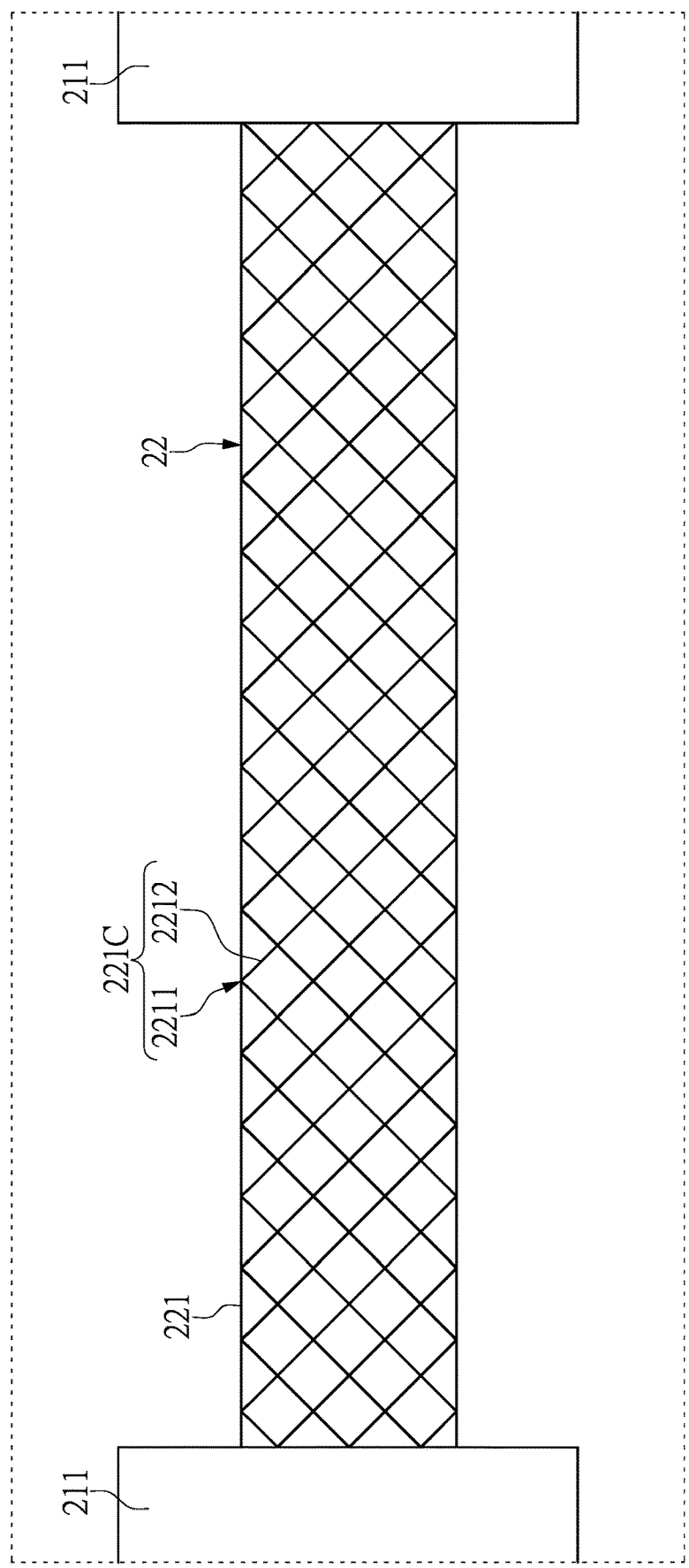
FIG. 5 and FIG. 6 are each an enlarged view of part II of FIG. 1, showing a wire design according to a second embodiment of the present disclosure.
Figure 6:
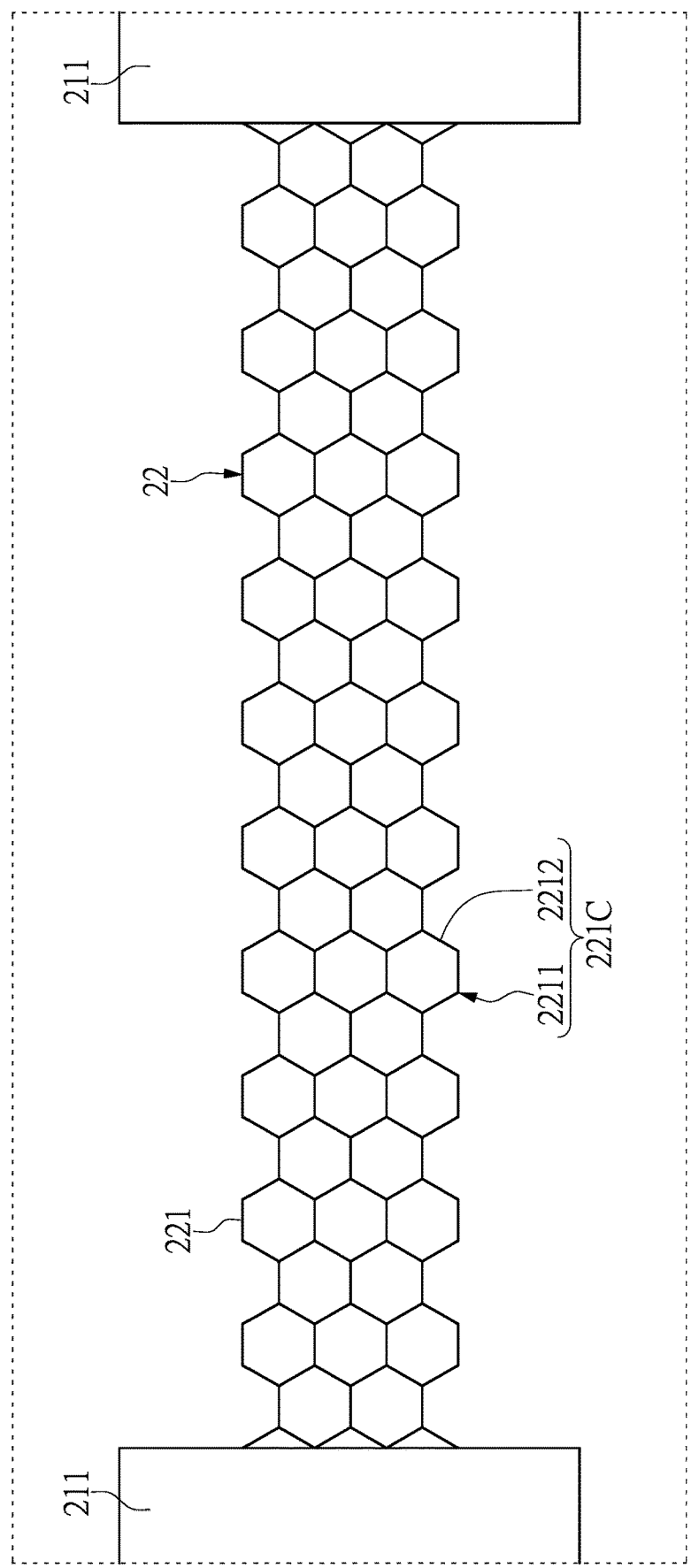

Referring to FIG. 5 and FIG. 6, showing another wire design of a stretchable conductive substrate Z, which are to be read in conjunction with FIG. 1, the stretchable conductive substrate Z mainly includes a substrate 1 and a first circuit layer 2. The substrate 1 has a plurality of predetermined areas 100. The first circuit layer 2 is formed on the substrate 1, and defines a conductive contact group 21 and at least one elastic wire structure 22 connected to each other in each of the predetermined areas 100. The elastic wire structure 22 has at least one patterned wire segment 221, thus having good elastic recovery performance, and a stretch rate of the elastic wire structure 22 along a length direction of the substrate 1 is from 0% to 60%. Related technical details described in the first embodiment are still valid in the present embodiment, and will not be reiterated herein to reduce repetition. Also, related technical details described in the present embodiment can also be applied in the first embodiment.

In the present embodiment, the patterned wire segment 221 adopts a different structural design, i.e., the patterned wire segment 221 has a plurality of hollow pattern units 221C that are connected to each other and linearly arranged along the length direction of the substrate 1. Each of the hollow pattern units 221C is in the shape of an n-sided polygon, where n is an integer greater than or equal to 3. Such a structural design can reduce or even eliminate fragility points of wires, thereby greatly reducing the risk of wire breaking during a stretching process, and can allow the wires to have good elastic recovery performance and electrical property stability (an impedance change in a stretched state is very small). It should be noted that, the shape of the hollow pattern units 221C is not particularly limited. For example, as shown in FIG. 5 and FIG. 6, the hollow pattern units 221C can be in the shape of a quadrilateral or hexagon.

Figure 7:
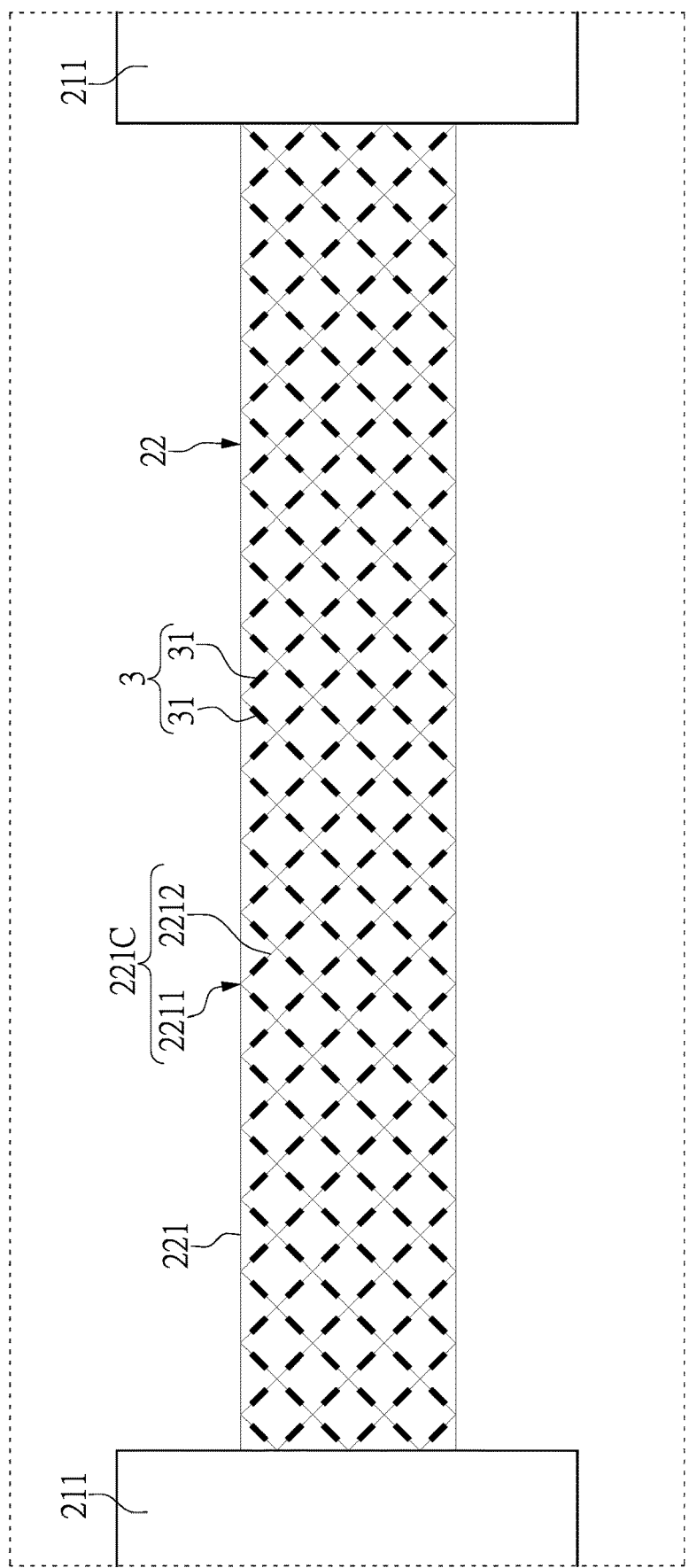
FIG. 7 and FIG. 8 are each an enlarged view of part II of FIG. 1, showing an optimization example of the wire design according to the second embodiment of the present disclosure.
Figure 8:
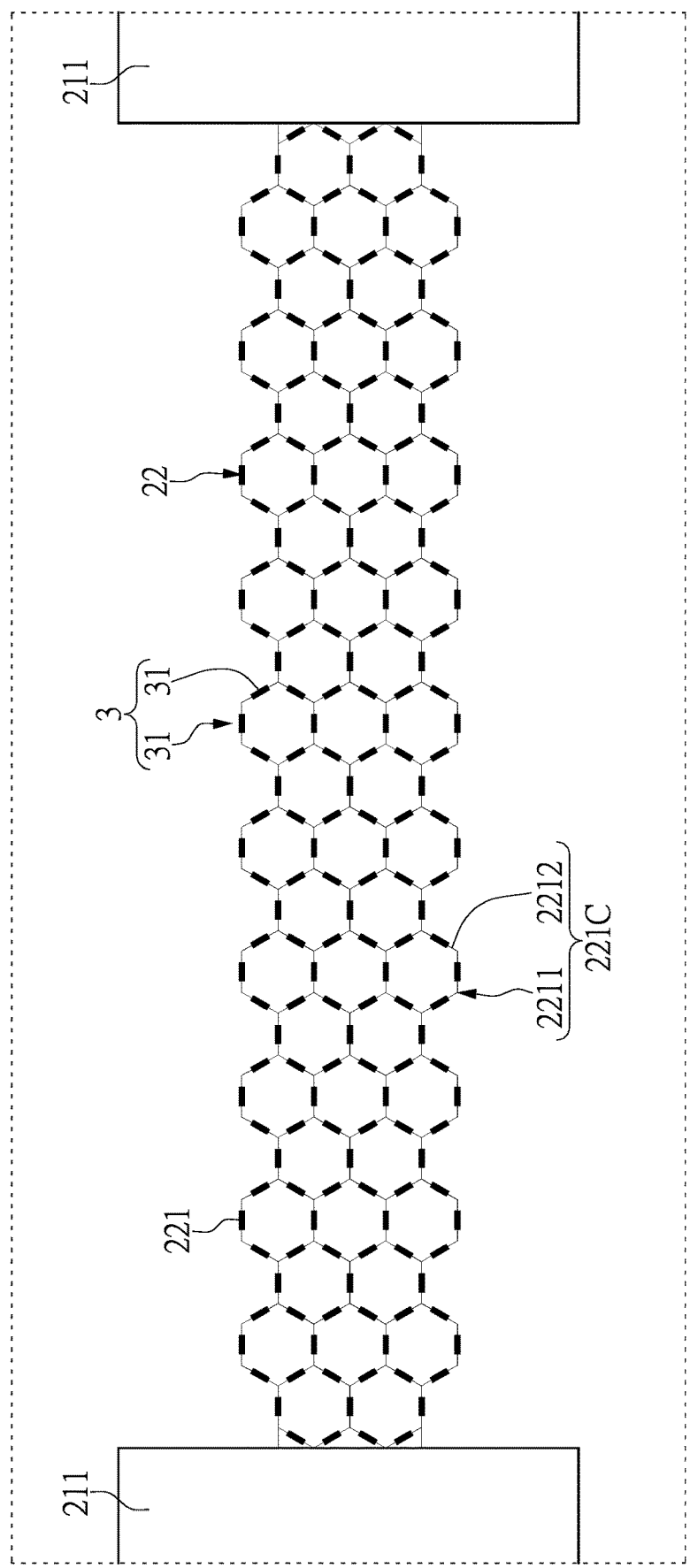
Figure 9:
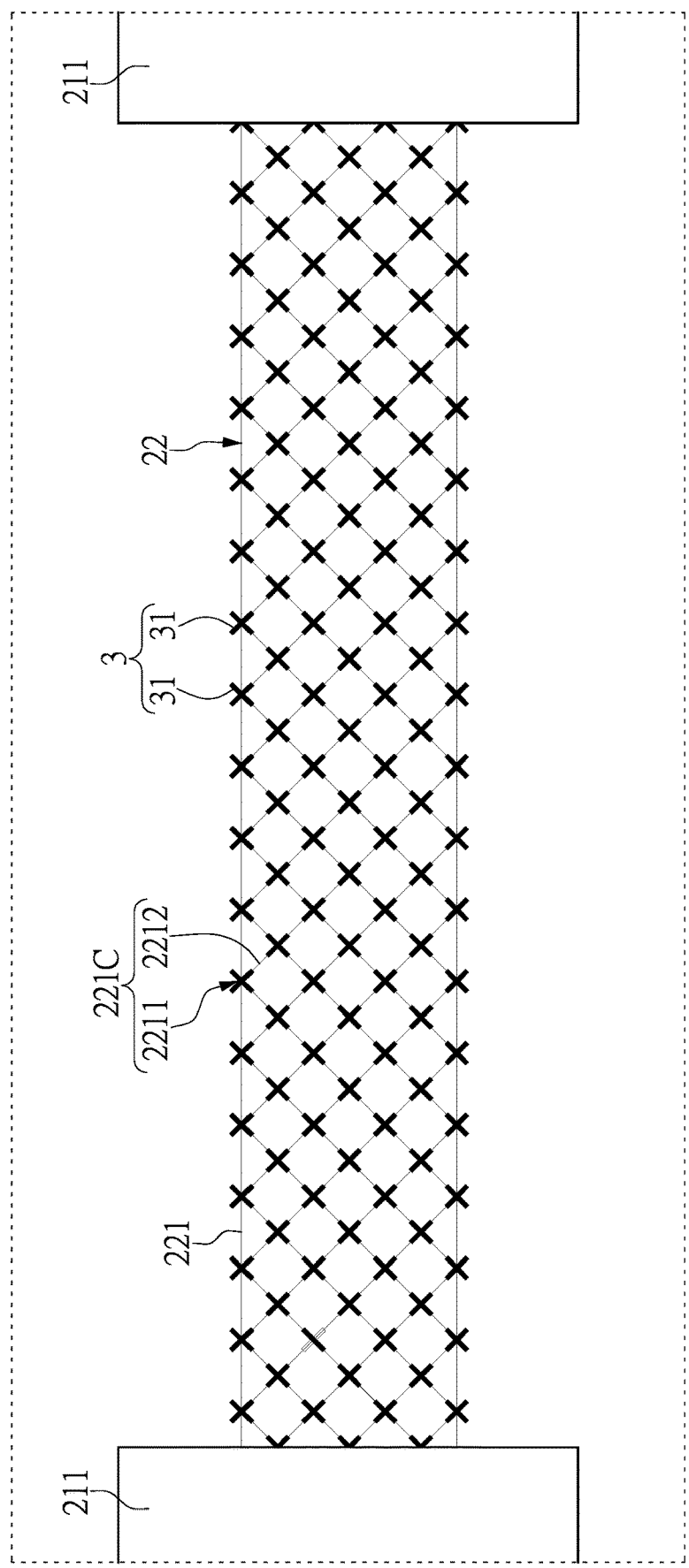
FIG. 9 and FIG. 10 are each an enlarged view of part II of FIG. 1, showing another optimization example of the wire design according to the second embodiment of the present disclosure.
Figure 10:
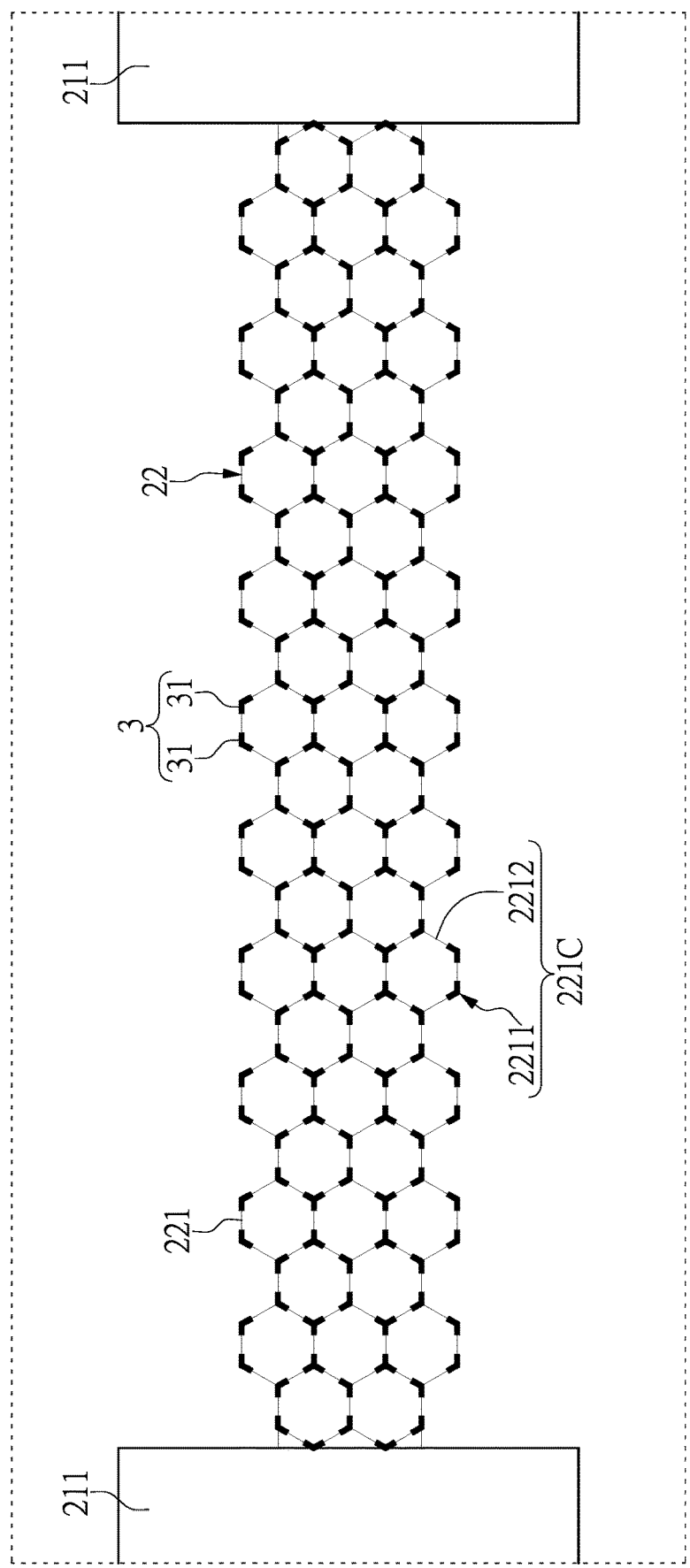

Reference is made to FIG. 7 to FIG. 10, which shows optimization designs of a main structure of the stretchable conductive substrate Z of the present disclosure. As shown in FIG. 7 to FIG. 10, the stretchable conductive substrate Z can further include an elastic conductive layer 3 that is formed on the first circuit layer 2. More specifically, the elastic conductive layer 3 includes a plurality of elastic conductive structures 31. Each of the hollow pattern units 221C include a plurality of corner portions 2211 and a plurality of straight edge portions 2212, and any adjacent two of the corner portions 2211 have one of the straight edge portions 2212 therebetween. The straight edge portions 2212 of each of the hollow pattern units 221C can each have one of the elastic conductive structures 31 thereon, as shown in FIG. 7 and FIG. 8. Also, the corner portions 2211 of each of the hollow pattern units 221C can each have one of the elastic conductive structures 31 thereon, as shown in FIG. 9 and FIG. 10. In consideration of the overall stretching effect and structural adaptability (the ability to adapt to different three-dimensional structures), an overlap rate between each of the corner portions 2211 (or the straight edge portions 2212) and the corresponding one of the elastic conductive structures 31 is from 5% to 50%.

Figure 11:
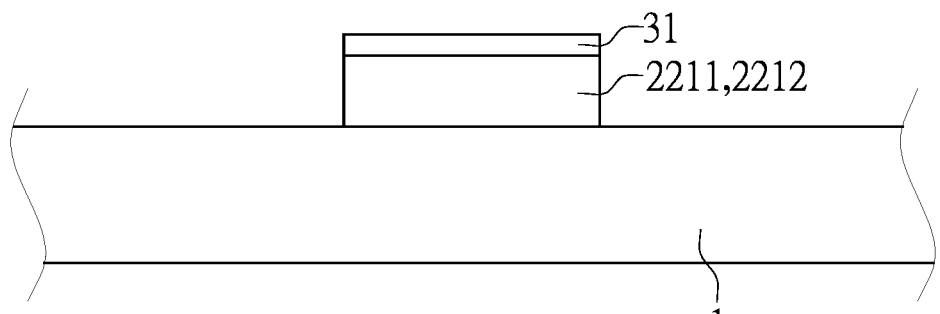
FIG. 11 shows an implementation of the optimization examples of the wire design according to the second embodiment of the present disclosure.
Figure 12:
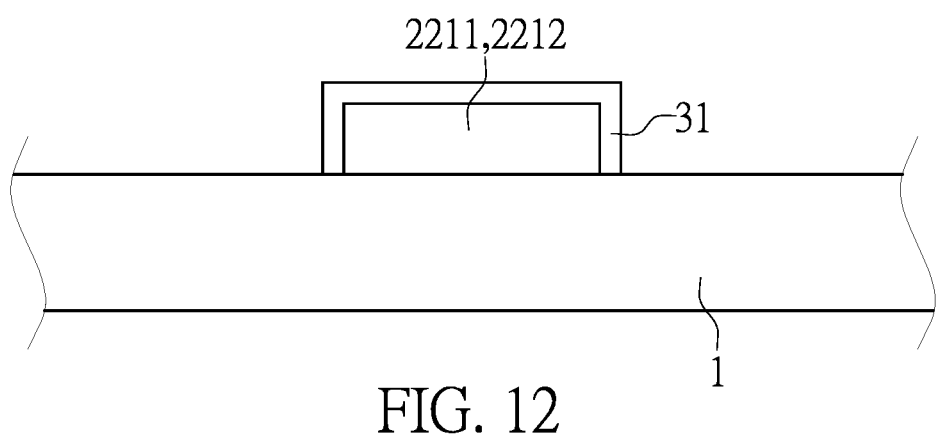
FIG. 12 shows another implementation of the optimization examples of the wire design according to the second embodiment of the present disclosure.
Figure 13:
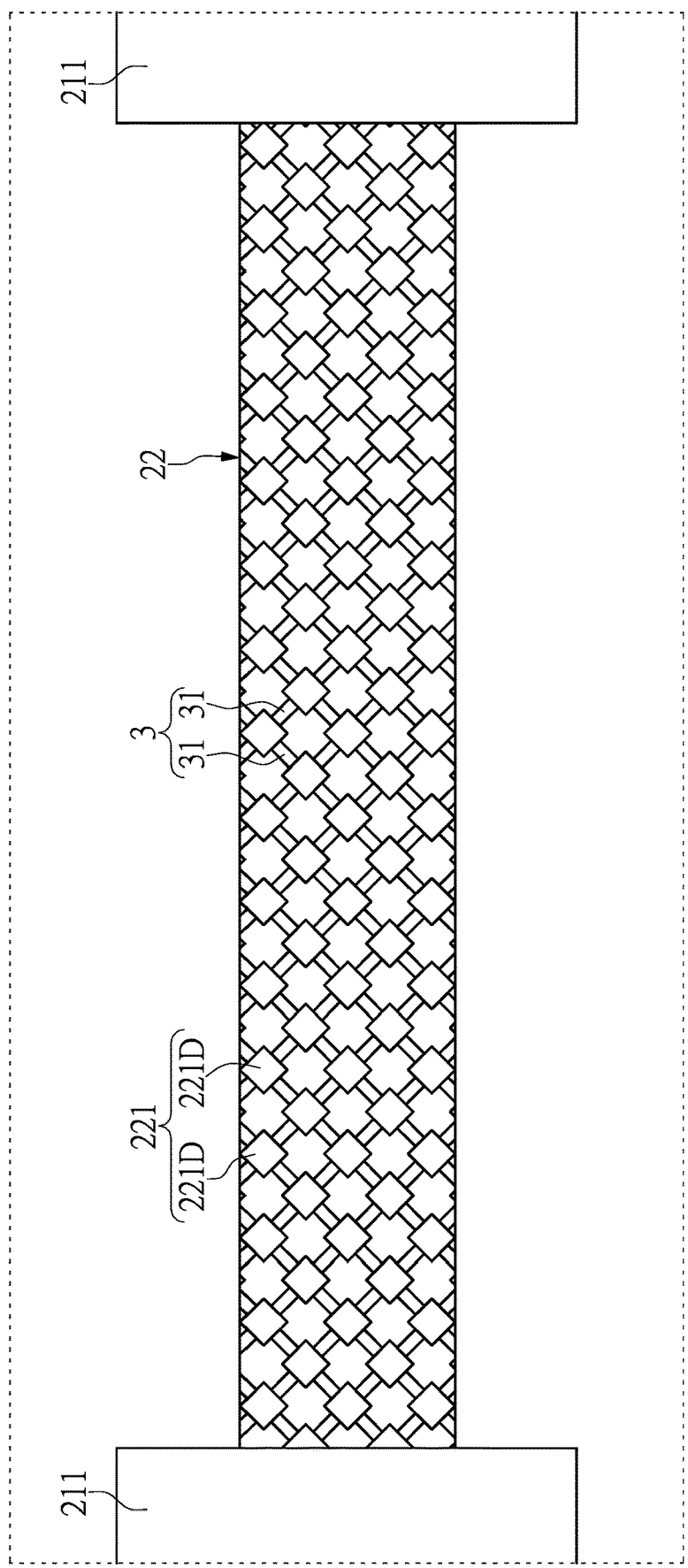
FIG. 13 is an enlarged view of part II of FIG. 1, showing a wire design according to a third embodiment of the present disclosure.

Reference is made to FIG. 11 and FIG. 12. In practice, the elastic conductive structure 31 can be only covered on an upper surface of the corner portion 2211 or the straight edge portion 2212, as shown in FIG. 11. Also, the elastic conductive structure 31 can be not only covered on the upper surface of the corner portion 2211 or the straight edge portion 2212, but also covered on a side surface of the corner portion 2211 or the straight edge portion 2212, as shown in FIG. 12. The above description is for exemplary purposes only, and is not intended to limit the scope of the present disclosure.

The elastic conductive layer 3 can be formed from a conductive composition. The conductive composition can be applied in the form of a conductive slurry and by way of printing, dispensing, spray printing, or transfer printing, but the present disclosure is not limited thereto. The conductive composition mainly includes 45 wt % to 65 wt % of a conductive material, based on 100 wt % of the conductive composition. The conductive material is selected from the group consisting of gold, palladium, platinum, nickel, copper, copper-clad silver, graphene, and carbon nanotubes. It should be noted that, the shape of the conductive material is not particularly limited, which can be shaped as a flake, sphere, or dendrite. In practice, the conductive composition can further include 10 wt % to 20 wt % of a binder, 0 wt % to 35 wt % of a solvent, and 0.1 wt % to 3 wt % of a processing aid, based on 100 wt % of the conductive composition.

In certain embodiments, the content of the conductive material in the conductive composition can be 45 wt %, 50 wt %, 55 wt %, 60 wt %, or 65 wt %. The content of the binder in the conductive composition can be 10 wt %, 15 wt %, or 20 wt %. The content of the solvent in the conductive composition can be 5 wt %, 10 wt %, 15 wt %, 20 wt %, 25 wt %, 30 wt %, or 35 wt %. The content of the processing aid in the conductive composition can be 0.5 wt %, 1.0 wt %, 1.5 wt %, 2.0 wt %, 2.5 wt %, or 3.0 wt %.

Specific examples of the binder include: a phenolic resin, an epoxy resin, an acrylate monomer, polyurethane, diisocyanate, hydroxyethyl methacrylate, acrylonitrile-butadiene-styrene copolymer (ABS), nylon, polylactic acid (PLA), polyethersulfone (PES), ethyl cellulose, hydroxyethyl methyl cellulose, and hydroxyethyl cellulose. Specific examples of the solvent include: butyl cellosolve acetate (BCA), diethylene glycol butyl ether acetate, diethylene glycol ethyl ether acetate, isophorone, N-hydroxymethyl acrylamide (NMA), diethylene glycol, tetrahydrofuran, polyethylene glycol and a diol (e.g., butanediol). Specific examples of the processing aid include: a dispersing agent, a leveling agent, an antioxidant, and a stabilizer. However, such examples are not intended to limit to the present disclosure.

Reference is made to FIG. 3 and FIG. 4. In a structure in which the stretchable conductive substrate Z further includes a second circuit layer 4, signal transmitting lines 41 of which can adopt the wire design as described in the present embodiment (i.e., the patterned wire segment 221 has a plurality of hollow pattern units 221C that are connected to each other and in a linear arrangement) to have the same or similar technical effects.

Third Embodiment

Referring to FIG. 11, showing still another wire design of a stretchable conductive substrate Z, which is to be read in conjunction with FIG. 1, the stretchable conductive substrate Z mainly includes a substrate 1, a first circuit layer 2, and an elastic conductive layer 3. The first circuit layer 2 is formed on the substrate 1, and the elastic conductive layer 3 is formed on the first circuit layer 2. Furthermore, the substrate 1 has a plurality of predetermined areas 100. The first circuit layer 2 defines a conductive contact group 21 and at least one elastic wire structure 22 connected to each other in each of the predetermined areas 100. The elastic wire structure 22 has at least one patterned wire segment 221, thus having good elastic recovery performance, and a stretch rate of the elastic wire structure 22 along a length direction of the substrate 1 is from 0% to 60%. Related technical details described in the first and second embodiments are still valid in the present embodiment, and will not be reiterated herein to reduce repetition. Also, related technical details described in the present embodiment can also be applied in the first and second embodiments.

In the present embodiment, the patterned wire segment 221 adopts a different structural design, i.e., the patterned wire segment 221 has a plurality of solid pattern units 221D that are separated from each other at a distance and linearly arranged along the length direction of the substrate 1. Each of the solid pattern units 221D is in the shape of an n-sided polygon, where n is an integer greater than or equal to 3. Furthermore, the elastic conductive layer 3 includes a plurality of elastic conductive structures 31, and any adjacent two of the solid pattern units 221 D are electrically connected to each other via one of the elastic conductive structures 31. Such a structural design can reduce or even eliminate fragility points of wires, thereby greatly reducing the risk of wire breaking during a stretching process, and can allow the wires to have good elastic recovery performance and electrical property stability (an impedance change in a stretched state is very small). It should be noted that, the shape of the solid pattern units 221D is not particularly limited as long as any adjacent two of the solid pattern units 221 D can be electrically connected to each other.

Reference is made to FIG. 3 and FIG. 4. In a structure in which the stretchable conductive substrate Z further includes a second circuit layer 4, signal transmitting lines 41 of which can adopt the wire design as described in the present embodiment (i.e., the patterned wire segment 221 has a plurality of solid pattern units 221D that are separated from each other at a distance and in a linear arrangement) to have the same or similar technical effects.

Fourth Embodiment

Figure 14:
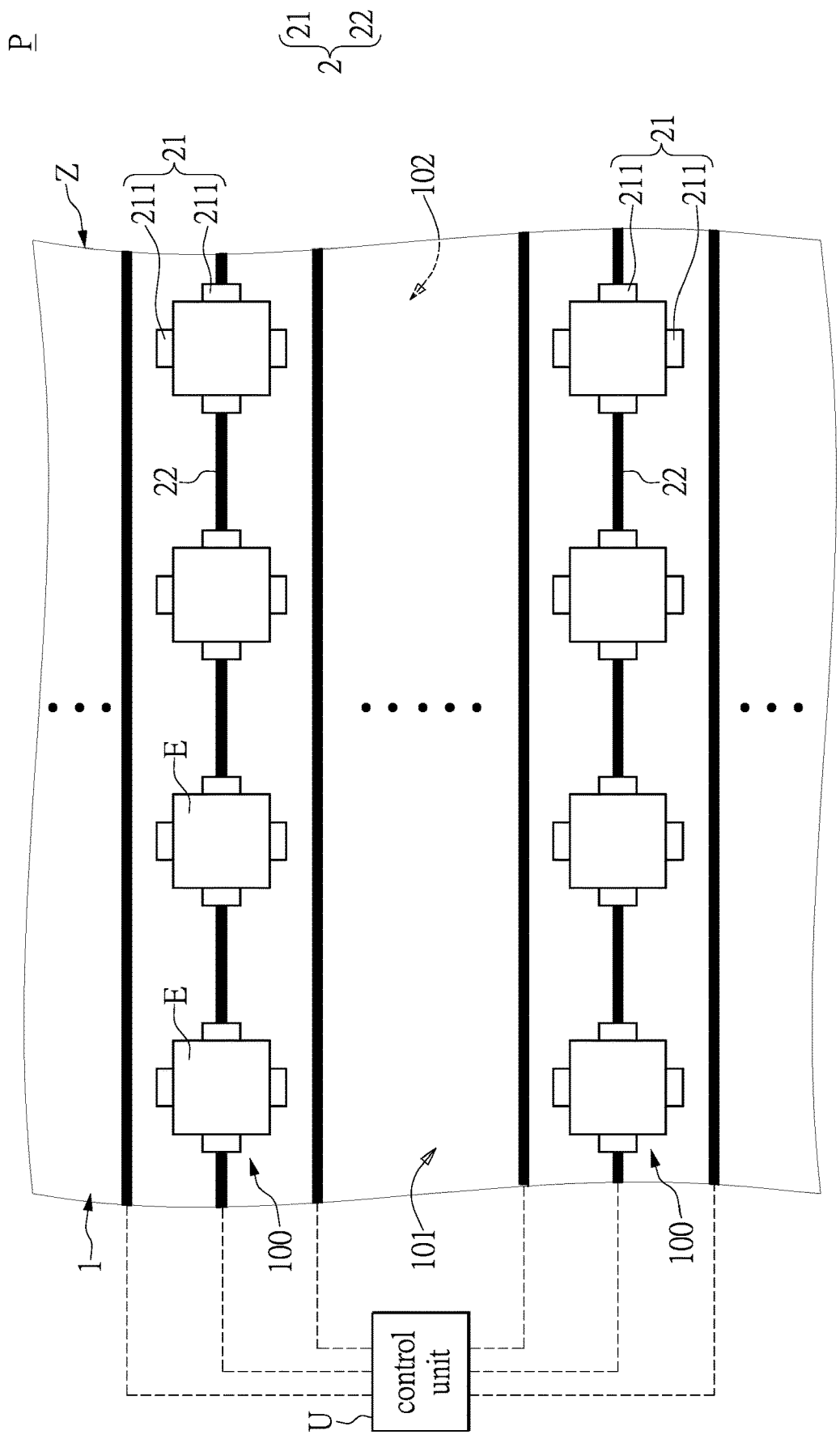
FIG. 14 is a structural schematic view of an electronic device applying the stretchable conductive substrate according to embodiments of the present disclosure.
Figure 15:
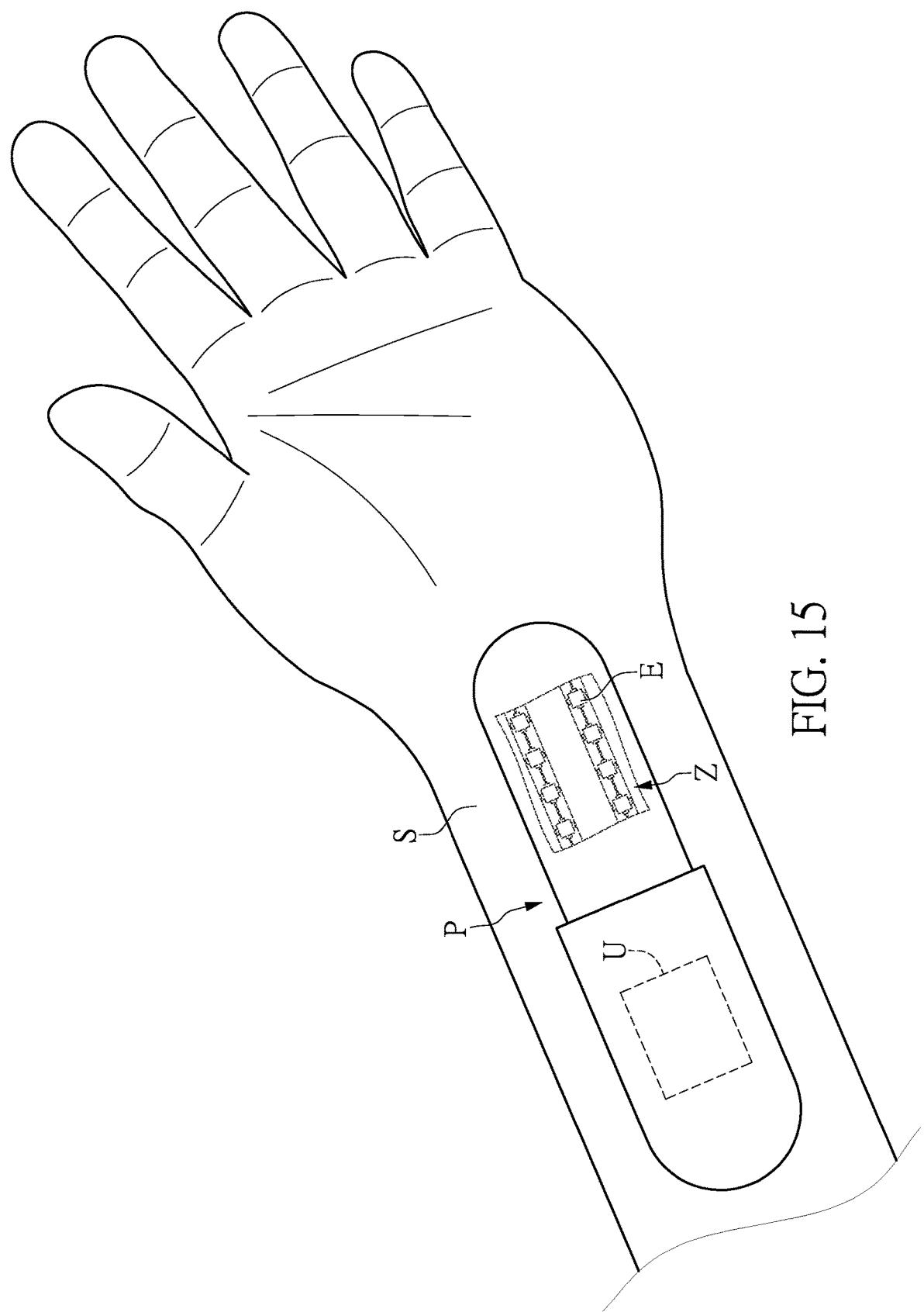
FIG. 15 is a schematic view showing a use state of the electronic device applying the stretchable conductive substrate according to the embodiments of the present disclosure.
Figure 16:
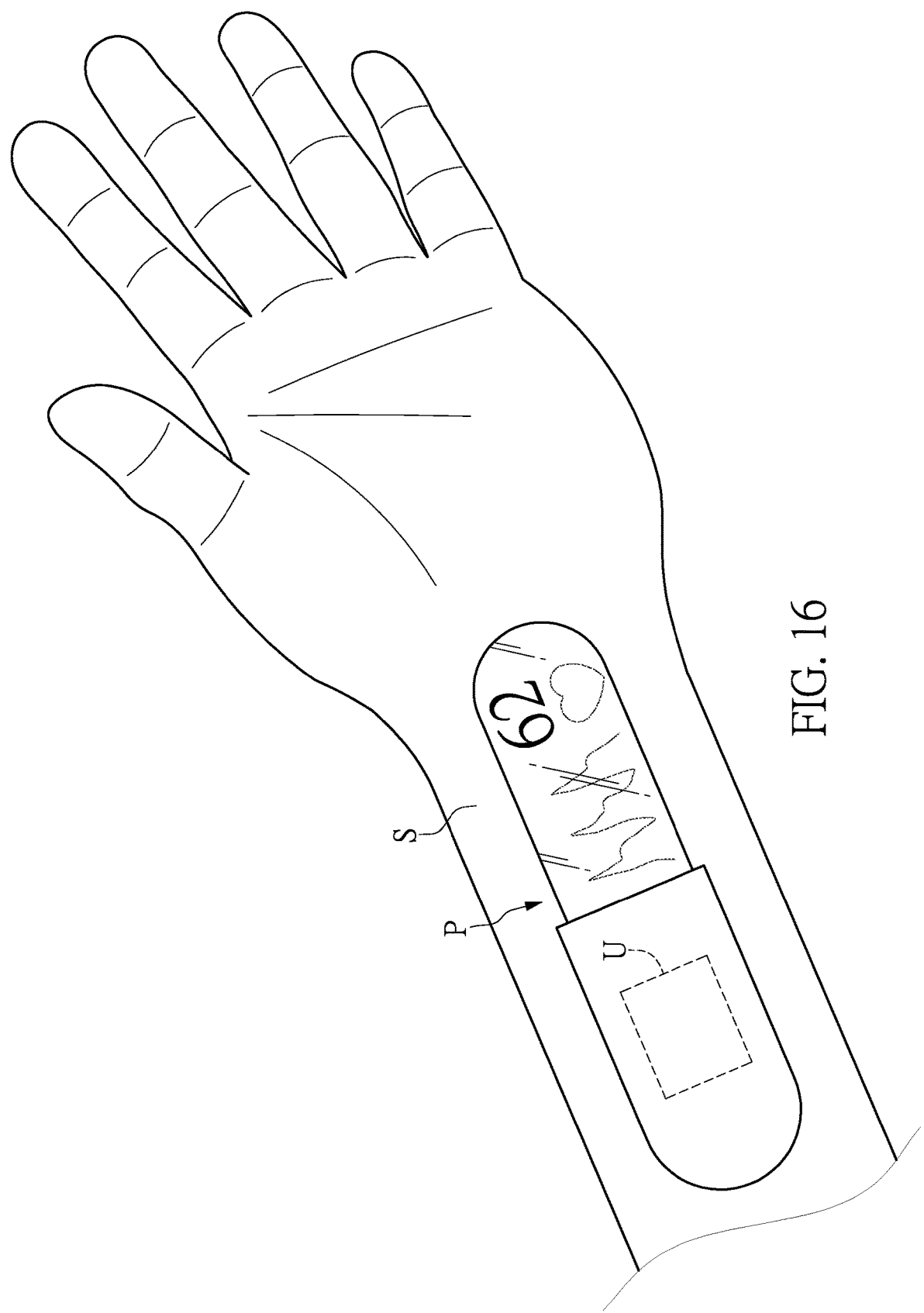
FIG. 16 is another schematic view showing the use state of the electronic device applying the stretchable conductive substrate according to the embodiments of the present disclosure.

Referring to FIG. 14 to FIG. 16, FIG. 14 showing an electronic device P applying a stretchable conductive substrate Z of the present disclosure, FIG. 15 and FIG. 16 showing a use state of the electronic device P, the electronic device P can include the stretchable conductive substrate Z as described in the first, second, or third embodiment, a plurality of electronic components E, and one or more control units U. The electronic components E are respectively disposed in a plurality of predetermined areas 100 of the stretchable conductive substrate Z. Each of the electronic components E is electrically connected and bonded to a conductive contact group 21 of the corresponding predetermined area 100. The one or more control units U are electrically connected to the stretchable conductive substrate Z, and can control the electronic components E via the stretchable conductive substrate Z.

For ease of understanding, an electronic skin is used herein as an example to describe the electronic device P provided in the present embodiment. As shown in FIG. 15 and FIG. 16, the electronic components E of the electronic device P can include one or more light emitting elements (e.g., light emitting diodes) and one or more detectors, and can be in contact with the skin S of a human body in use, so as to monitor data about breathing, heart rate, exercise, sleep, etc. It is worth mentioning that, in the presence of the stretchable conductive substrate Z, the electronic device P can withstand a certain degree of stretching, bending, and tension forces in a length or thickness dimension, and can function normally even when being stretched or deformed during use. Therefore, the performance of the electronic device P will not be negatively affected.

Beneficial Effects of the Embodiments

One of the beneficial effects of the subject matter provided by the present disclosure is that, the stretchable conductive substrate can reduce or even eliminate fragility points of wires, thereby greatly reducing the risk of wire breaking during a stretching process, and can allow the wires to have good elastic recovery performance and electrical property stability (an impedance change in a stretched state is very small), by virtue of "the at least one elastic wire structure has at least one patterned wire segment and a stretch rate thereof along a length direction of the substrate is from 0% to 60%".

Furthermore, the stretchable conductive substrate can further include an elastic conductive layer. The elastic conductive layer is formed from a conductive composition (e.g., a conductive slurry) that is applied to the circuit layer. Accordingly, metal wires can be prevented from being damaged due to a bending or stretching stress, and an impedance change caused by a bending or stretching deformation of the metal wires can be suppressed.

Furthermore, the electronic device applying the stretchable conductive substrate of the present disclosure can withstand a certain degree of stretching, bending, and tension forces in a length or thickness dimension, and can function normally even when being stretched or bent during use. Therefore, the performance of the electronic device P can adapt to different three-dimensional structures and will not be negatively affected.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A stretchable conductive substrate, comprising:
   a substrate having a plurality of predetermined areas; and
   a circuit layer formed on the substrate and defining a conductive contact group and at least one elastic wire structure connected to the conductive contact group in each of the predetermined areas, wherein the at least one elastic wire structure has at least one patterned wire segment and a stretch rate thereof along a length direction of the substrate is from 0% to 60%;
   wherein the at least one patterned wire segment has a plurality of hollow pattern units that are connected to each other and linearly arranged along the length direction of the substrate; each of the hollow pattern units is in the shape of an n-sided polygon, where n is an integer greater than or equal to 3.

2. The stretchable conductive substrate according to claim 1, further comprising an elastic conductive layer that is formed on the circuit layer.

3. The stretchable conductive substrate according to claim 2, wherein the elastic conductive layer is formed from a conductive composition, and based on 100 wt % of the conductive composition, the conductive composition includes 45 wt % to 65 wt % of a conductive material that is selected from the group consisting of gold, palladium, platinum, nickel, copper, copper-clad silver, graphene, and carbon nanotubes.

4. The stretchable conductive substrate according to claim 2, wherein each of the hollow pattern units includes a plurality of corner portions and a plurality of straight edge portions, and any adjacent two of the corner portions have one of the straight edge portions therebetween; the elastic conductive layer includes a plurality of elastic conductive structures, and the corner portions of each of the hollow pattern units each have one of the elastic conductive structures thereon.

5. The stretchable conductive substrate according to claim 4, wherein an overlap rate between each of the corner portions and the corresponding one of the elastic conductive structures is from 5% to 50%.

6. The stretchable conductive substrate according to claim 2, wherein each of the hollow pattern units includes a plurality of corner portions and a plurality of straight edge portions, and any adjacent two of the corner portions have one of the straight edge portions therebetween; the elastic conductive layer includes a plurality of elastic conductive structures, and the straight edge portions of each of the hollow pattern units each have one of the elastic conductive structures thereon.

7. The stretchable conductive substrate according to claim 6, wherein an overlap rate between each of the straight edge portions and the corresponding one of the elastic conductive structures is from 5% to 50%.

* * * * *